United States Patent [19]

Burgess

[11] Patent Number: 5,034,922
[45] Date of Patent: Jul. 23, 1991

[54] INTELLIGENT ELECTRICALLY ERASABLE, PROGRAMMABLE READ-ONLY MEMORY WITH IMPROVED READ LATENCY

[75] Inventor: Bradley G. Burgess, Austin, Tex.

[73] Assignee: Motorola, Inc., Schaumburg, Ill.

[21] Appl. No.: 135,945

[22] Filed: Dec. 21, 1987

[51] Int. Cl.[5] .............................................. G11C 7/00
[52] U.S. Cl. ........................ 365/189.07; 365/189.05; 365/218
[58] Field of Search ................... 365/189.05, 189.07, 365/218, 189.01, 230.08

[56] References Cited

U.S. PATENT DOCUMENTS

| | | | |
|---|---|---|---|
| 4,249,250 | 2/1981 | Scowen et al. | 365/189.07 |
| 4,410,965 | 10/1983 | Moore | 365/189.05 |
| 4,460,982 | 7/1984 | Gee et al. | 365/104 |
| 4,811,294 | 3/1989 | Kobayashi et al. | 365/189.07 |

Primary Examiner—James W. Moffitt
Attorney, Agent, or Firm—Jonathan P. Meyer

[57] ABSTRACT

An intelligent electrically erasable, programmable read-only memory achieves improved worst-case read operation latency by allowing for the interruption of write operations by subsequently received read requests. In the preferred embodiment, a state machine controller executes write operations by an iterative process of write pulses and write verify cycles. In addition, cells are erased prior to being written to by a similar iterative process. Both the write operations and the erase operations may be interrupted by read requests received after the write operation has begun execution. To avoid reading incorrect data in the case of a read operation at the same address as an interrupted write operation, a comparator matches read operation addresses with latched write operation addresses and provides the read operation data from a write data latch in the case of a match.

6 Claims, 4 Drawing Sheets

INTELLIGENT ELECTRICALLY ERASABLE, PROGRAMMABLE READ-ONLY MEMORY WITH IMPROVED READ LATENCY

FIELD OF THE INVENTION

The present invention relates, in general, to electrically erasable, programmable read-only memories (EEPROMs). More particularly, the invention relates to EEPROMs which include a controller for autonomously executing read and write operations.

BACKGROUND OF THE INVENTION

U.S. Pat. No. 4,460,982 (hereinafter, Gee et al) discloses an intelligent EEPROM. During both programming and erasing, the device disclosed by Gee et al iteratively applies pulses of programming voltage to the memory cell or cells being accessed and, between pulses, compares the state of the cells to the desired end state.

The advantages of an intelligent EEPROM over a "dumb" device are well known. Among these are the relative ease with which such a device may be integrated with a microprocessor-controlled system. Prior to the Gee et al invention, a microprocessor writing to an EEPROM was required to control the application and timing of the programming voltage to the EEPROM, thus precluding the execution of other tasks during the relatively long program/erase cycles.

In a microprocessor-controlled system using EEPROMs according to Gee et al, and as further described hereinbelow, the microprocessor is free to continue the execution of other tasks after having instructed the intelligent EEPROM to write a data value to a particular location. However, if the microprocessor issues a read instruction to the EEPROM while the write cycle is being executed, the memory is unavailable. In other words, the read request must be held pending until the previously issued write request is completed. Since the time required to program an EEPROM cell is very long compared to the speed at which a typical microprocessor operates, such a system may have an unacceptably long worst case read latency; that is, the time required to complete a read operation after the request is first issued.

SUMMARY OF THE INVENTION

Accordingly, it is an object of the present invention to provide an EEPROM with improved read latency.

It is a further object of the present invention to provide an intelligent EEPROM capable of executing a requested read operation prior to the completion of a previously received write request.

These and other objects and advantages of the present invention are provided by an EEPROM comprising an array of EEPROM cells, read control means for reading one of said cells in response to receipt of a read control signal and a read address and means for writing one of said cells in response to receipt of a write control signal, a write address and data and wherein logic for writing further comprises write control logic for iteratively applying a write pulse to said cell and reading said cell until the cell is in a desired state, the improvement comprising logic for halting said write control logic in response to receipt of said read control signal and read address, for activating said read control logic and for restarting said write control means after said read control logic has completed reading said cell.

These and other objects and advantages of the present invention will be apparent to one skilled in the art from the detailed description below, taken together with the drawings.

DETAILED DESCRIPTION OF THE INVENTION

The terms "assert", "assertion", "negate" and "negation" will be used to avoid confusion when dealing with a mixture of "active high" and "active low" signals. "Assert" and "assertion" are used to indicate that a signal is rendered active, or logically true. "Negate" and "negation" are used to indicate that a signal is rendered inactive, or logically false.

The terms "write", "program" and "erase", and forms thereof, will be used to refer to various acts involving changing the state of one or more EEPROM cells. "Write" is used to refer to the act of directing the EEPROM device to store a particular data value or values at a particular location. As is familiar, depending on the previous state of each location and the new data value to be stored there, the state of that particular EEPROM cell may or may not be changed in response to the "write". "Program" is used to refer to the act of placing an EEPROM cell in its programmed state, as compared to its erased state. "Erase", likewise, is used to refer to the act of placing an EEPROM cell in its erased state.

Figure 1:
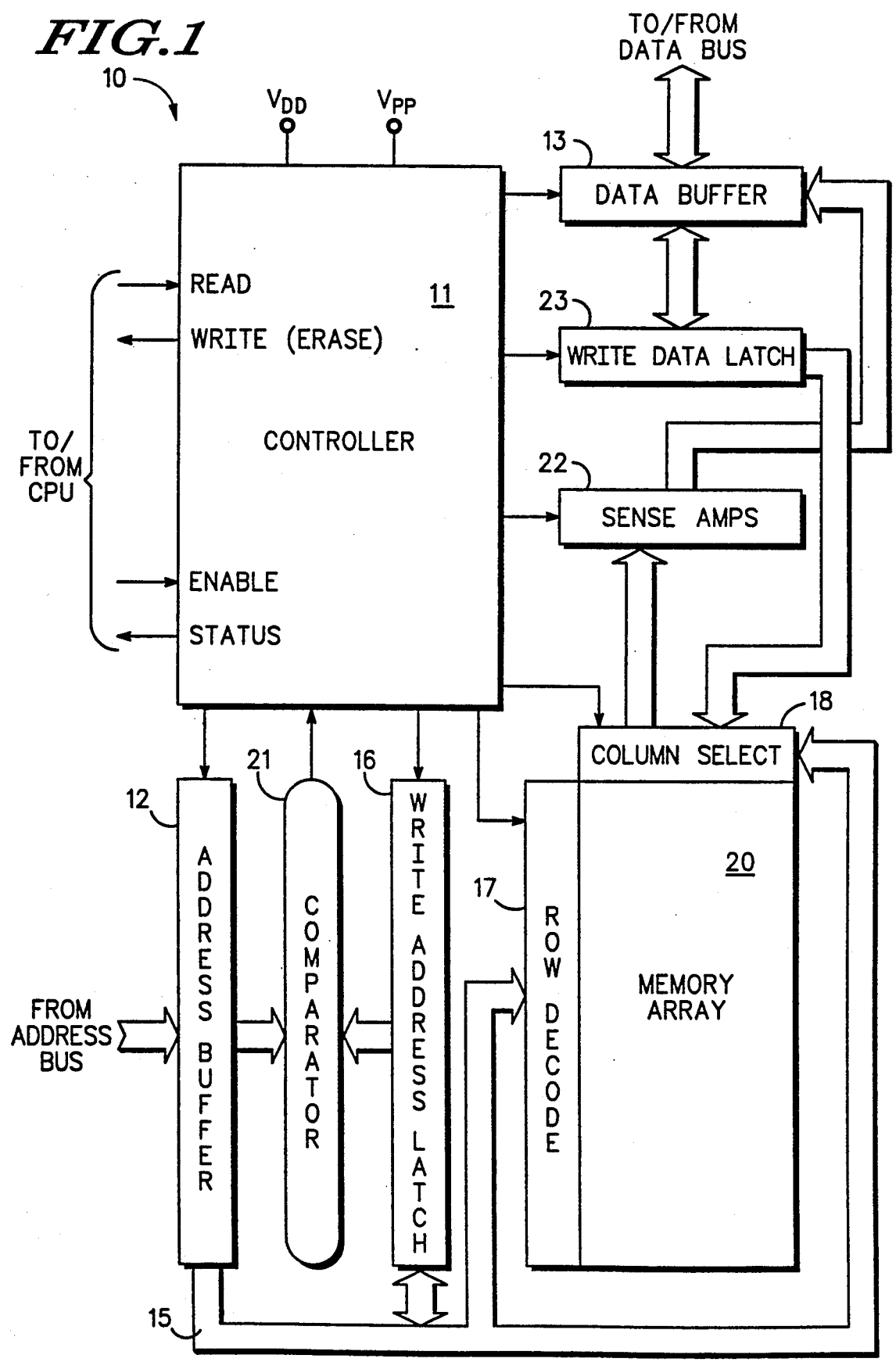
FIG. 1 is a block diagram illustrating an EEPROM of a particular embodiment of the present invention.

FIG. 1 illustrates an intelligent EEPROM 10. As is familiar, EEPROM 10 may be a memory-only device or it may be, as is the case in the preferred embodiment, a portion of an integrated circuit microcomputer. Controller 11 receives two power supply inputs: $V_{DD}$ and $V_{PP}$. $V_{DD}$ is the usual positive power supply voltage which is typically 5 volts and $V_{PP}$ is the EEPROM programming voltage which is typically approximately 20 volts. Controller 11 also receives three control signals: READ, WRITE and ENABLE. In the preferred embodiment of an integrated circuit microcomputer, these three control signals are provided by the CPU. As is familiar, the READ and WRITE control signals are commonly provided by a single control line which signifies "read" when it is high and signifies "write" when it is low.

Controller 11 also provides a status output. The status output signals when a write request has been completed. Such a status output may be useful to the CPU, for instance. The status output is an optional feature of the preferred embodiment.

An address bus and a data bus also provide interconnections between EEPROM 10 and an external controller such as the CPU. The address bus is connected to an address buffer 12, which also receives control inputs from controller 11. Similarly, the data bus is connected to a data buffer 13, which also receives control inputs from controller 11.

Address buffer 12 is coupled, by means of a set of internal address lines 15, to a write address latch 16 and to row decode apparatus 17. Write address latch 16 and row decode apparatus 17 both receive control inputs from controller 11. In addition, although it is not shown here to preserve clarity, controller 11 controls address lines 15 to determine whether the address supplied to row decode apparatus 17 is provided by address buffer 12 or by write address latch 16. Further, address lines 15 are connected to a column select apparatus 18 and controller 11 similarly controls the source of the address supplied thereto.

Both address buffer 12 and write address latch 16 are connected to a comparator 21, which compares the addresses stored therein and provides an output indicative of whether the two addresses are the same to controller 11.

In the fashion familiar in the art, row decode apparatus 17 and column select apparatus 18 are coupled to a memory array 20, which comprises a plurality of EEPROM cells arranged in an array of rows and columns. Both row decode apparatus 17 and column select apparatus 18 receive control inputs from controller 11. In the preferred embodiment, row decode apparatus 17 selects, in response to the address supplied thereto, one of the rows of array 20 and column select apparatus 18 selects eight of the columns thereof, thus accessing the eight cells lying at the intersections of the selected row and columns. Of course, many other memory organizations are possible.

Column select apparatus 18 is connected to a plurality of sense amplifiers 22, which also receive control inputs from controller 11. Sense amplifiers 22 are coupled, by means of column select apparatus 18, to the selected columns of array 20 and provide logic-level outputs indicative of whether the cells being accessed are programmed or erased. In the preferred embodiment, there would typically be eight sense amplifiers, each providing an indication of whether one of the eight cells being accessed is programmed or erased.

The outputs of sense amplifiers 22 are connected to data buffer 13. Also connected to data buffer 13 is a write data latch 23, which also receives control inputs from controller 11. Controller 11 is able to control whether the data supplied to data buffer 13 is provided by sense amplifiers 22 or by write data latch 23 and is also able to control the storing of data from data buffer 13 into write data latch 23.

Figure 2:
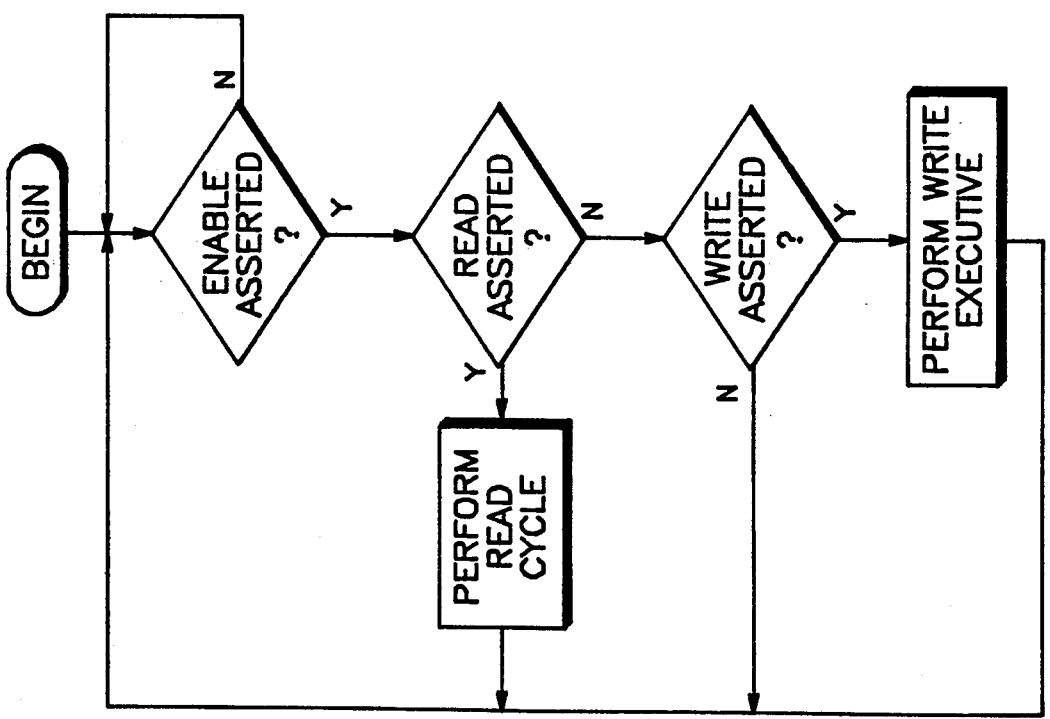
FIG. 2 is a flow chart illustrating a portion of a method of operating the apparatus of FIG. 1 according to a particular embodiment of the present invention.

FIG. 2 is a flow chart illustrating the basic control program of controller 11. The flow chart of FIG. 2 is an endless loop which indicates that controller 11 is constantly alert for commands received by means of the READ, WRITE and ENABLE inputs. Controller 11 initially examines the ENABLE input to determine if EEPROM 10 is being accessed. If ENABLE has not been asserted, controller 11 simply continues to wait for its assertion.

Once ENABLE has been determined to have been asserted, controller 11 examines READ to determine if it has been asserted. If so, controller 11 performs the read cycle illustrated in FIG. 3, then continues to wait for another assertion of ENABLE. If READ has not been asserted, WRITE is examined to determine if it has been asserted. If not, controller 11 returns to wait for an access of EEPROM 10. If WRITE has been asserted, controller 11 performs the write executive control program illustrated in FIG. 4, then continues to wait for another access.

In the preferred embodiment, controller 11 is a state machine, although many other implementations are possible. Therefore, the flow chart of FIG. 2, and those of the following figures, are not intended to necessarily imply sequential operations. For example, it is not necessarily true in the case of a state machine controller that the READ input would be examined prior to the examination of the WRITE input. In some cases, of course, sequence is important to the operation of EEPROM 10. These points will be apparent from the discussion below.

Figure 3:
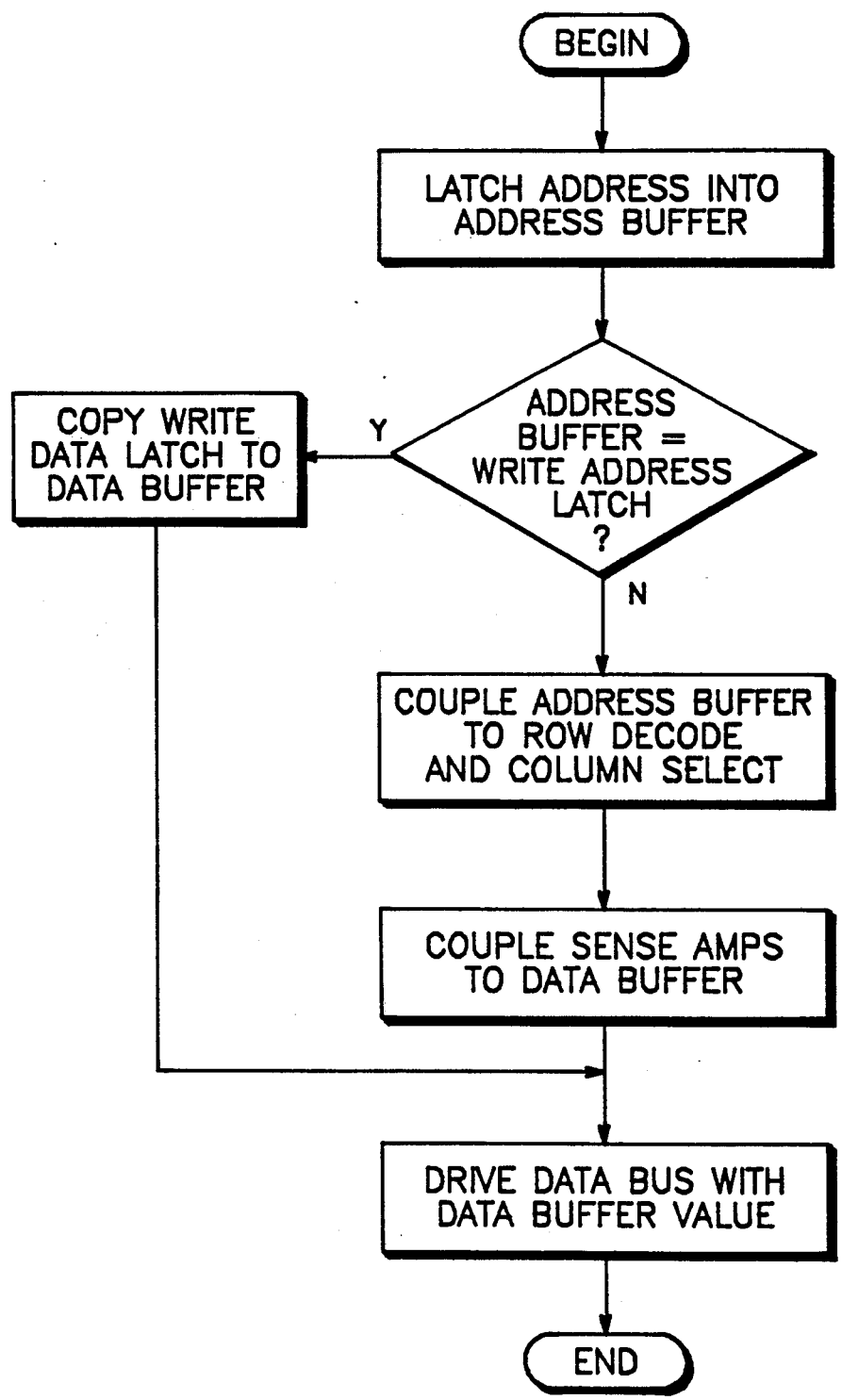
FIG. 3 is a flow chart illustrating a read cycle portion of the flow chart of FIG. 2.

FIG. 3 illustrates the process by which controller 11 responds to a read request. First, the address appearing on the external address bus is stored temporarily in address buffer 12. Next, the address buffer contents are compared to the address currently stored in write address latch 16 by means of comparator 21. As will be more readily apparent from the discussion of the write process below, it is possible that the read request being responded to has interrupted an uncompleted write. If this is the case, it is important that the address being accessed by the read request be compared to the address of the interrupted write, to avoid reading an incompletely programmed cell or cells. If the addresses in address buffer 12 and write address latch 16 match, then the data currently stored in the data latch 23 is provided to data buffer 13 for output on the data bus. Thus, if a read interrupts a write at the same address, the correct data will be read, just as if the interrupted write had been completed.

If the two addresses do not match, controller 11 couples address buffer 12 to row decode apparatus 17 and column select apparatus 18 in order to provide the read address thereto. It is assumed that row decode apparatus 17 and column select apparatus 18 then respond by selecting the appropriate row and columns of array 20. Controller 11 next couples sense amplifiers 22 to data buffer 13. This provides data buffer 13 with the logic values determined by sense amplifiers 22 to correspond to the states of the selected cells.

Finally, controller 11 directs data buffer 13 to drive the data bus with either the data provided by sense amplifiers 22 or by write data latch 23, depending on the earlier comparison of addresses. This terminates the read process.

Figure 4:
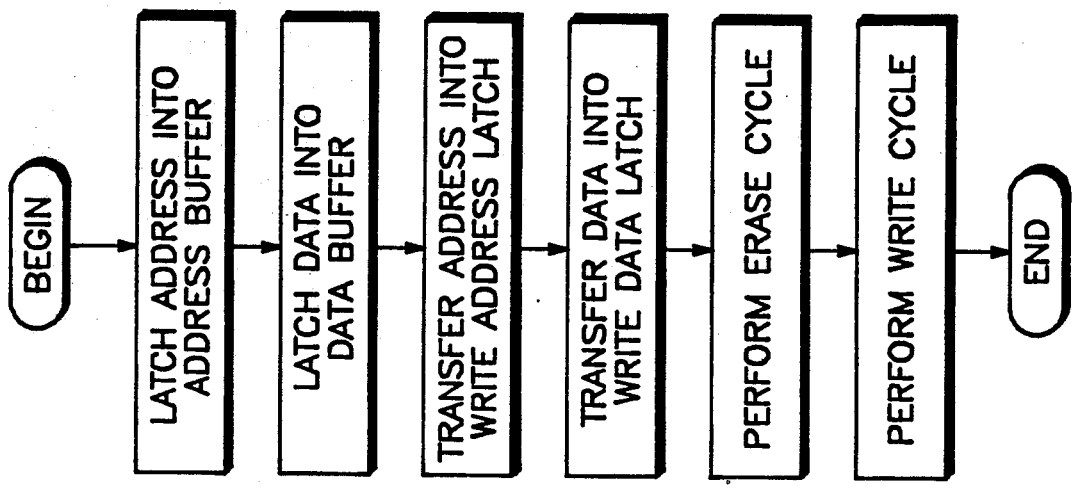
FIG. 4 is a flow chart illustrating a write executive portion of the flow chart of FIG. 2.
Figure 6:
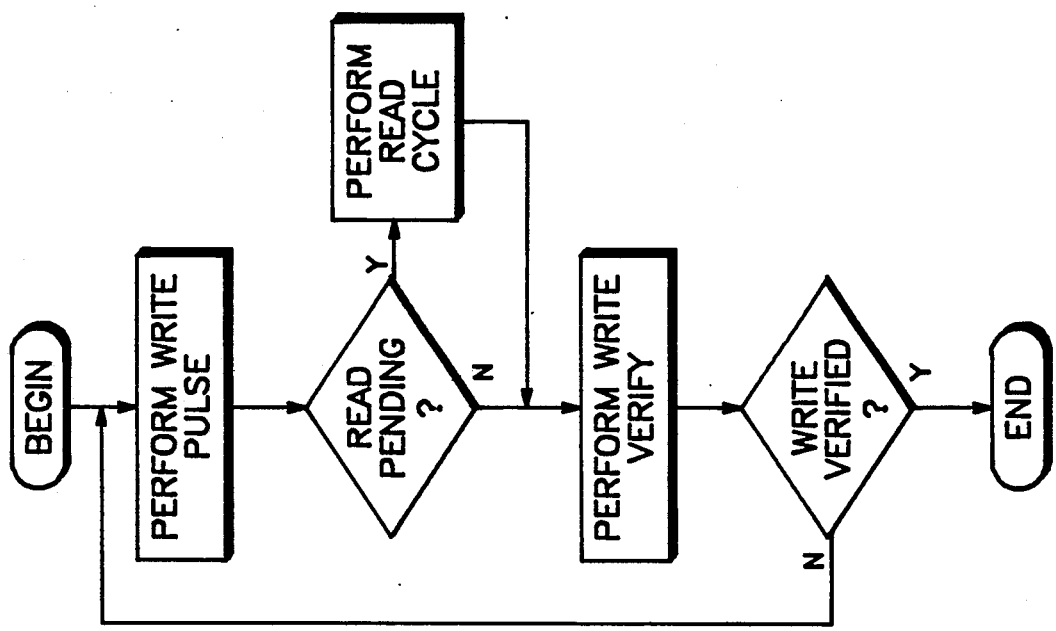
FIG. 6 is a flow chart illustrating a write cycle portion of the flow chart of FIG. 4.
Figure 5:
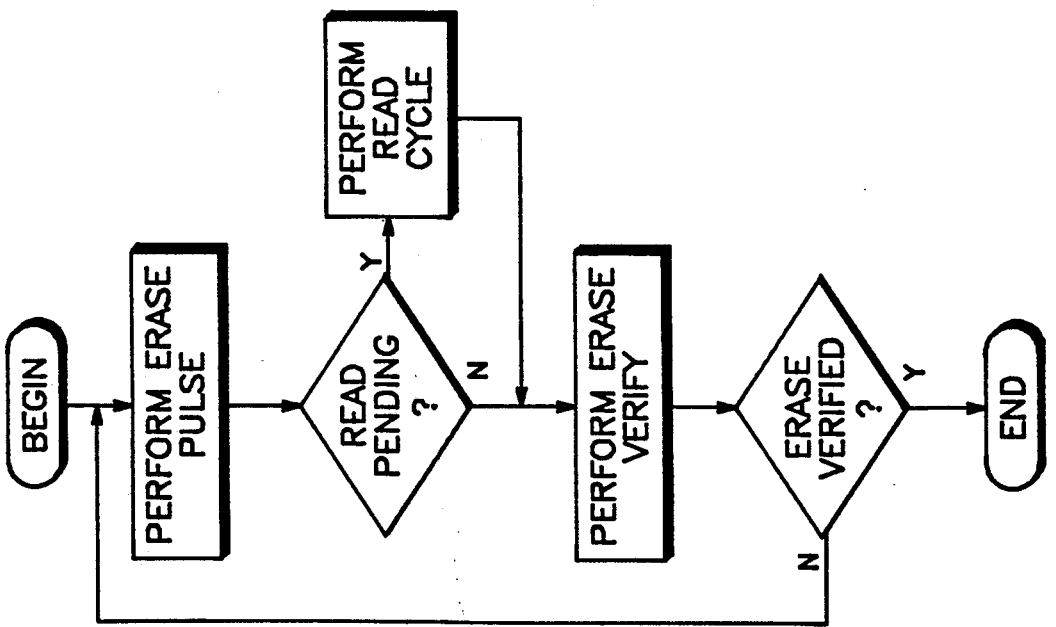
FIG. 5 is a flow chart illustrating an erase cycle portion of the flow chart of FIG. 4.

FIG. 4 illustrates the overall write process executed by controller 11 in response to a write request. This flow chart illustrates the process referred to in FIG. 1 as the "write executive". First, controller 11 enables address buffer 12 and data buffer 13 to temporarily store the address and data values received via therefore the external busses. Next, the address is transferred from address buffer 12 to write address latch 16 and the data is transferred from data buffer 13 to write data latch 23. Although not explicitly shown here, controller 11 then must provide the address from write address latch 16 to row decode apparatus 17 and to column select apparatus 18 in order to select the cells to be written. Next, an erase cycle as illustrated in FIG. 5 is performed. Finally, a write cycle as illustrated in FIG. 6 is performed.

As is familiar, EEPROMs commonly erase each cell before writing a new value to it, as illustrated here. It is also known that it is possible to eliminate some unnecessary erasing by performing an exclusive OR operation on the data to be written and the data currently stored in the cell or cells being accessed. Another possible method is to check for zeros in the data currently in either the data to be written or the data currently in the cells. These modifications may be easily made within the context of the present invention.

FIG. 5 illustrates the erase cycle performed prior to a write cycle. As is familiar in the art, it is also possible to design controller 11 so that the erase cycle illustrated here is available independently of a write request. First, controller 11 performs an erase operation. This consists, essentially, of applying the programming voltage to the cells being accessed in a predetermined way for a predetermined length of time. In a typical EEPROM design, a cell is erased by applying $V_{PP}$ to its drain and control gate while coupling its source to ground. The time of each erase pulse is chosen to be some fraction of the total time anticipated to be necessary to erase a typical cell and may be in the range of 1 to 5 milliseconds. Both the details of the programming voltage application and the time for which it applied during each pulse are subject to wide variation with different cell designs and manufacturing techniques.

After an erase pulse is applied, controller 11 examines the READ input to determine if a read request has been made since the write was begun. If so, the read cycle of FIG. 3 is executed. If no read is pending, or after the read cycle has been completed, an erase verify cycle is performed. This entails using sense amplifiers 22 to determine the states of the cells being accessed and determining whether they are erased.

If the erase verify cycle results in a verification that the cells have been erased, the erase cycle is terminated. If not, another erase pulse is performed and the process is repeated.

FIG. 6 illustrates the write cycle of FIG. 4. As is apparent, it is identical to the erase cycle of FIG. 5 in its general flow. The write pulse applied will be slightly different from the erase pulse of FIG. 5. In a typical EEPROM design, a cell is programmed by applying $V_{PP}$ to its drain while grounding its source and control gate. Again, both these details and the time for which the programming voltage is applied will vary greatly. In addition, the write pulse is different from the erase pulse in that the cells being accessed are not necessarily treated identically. The data in write data latch 23 must, of course, be used to determine which cells are to be programmed and which are to be left in the erased state. Only those cells which are to be programmed have the programming voltage applied during the write pulse.

The write verify step of FIG. 6 is also slightly different from the erase verify step of FIG. 5. In the case of the write verify, the sensed cell states are compared to the data in write data latch 23 in order to determine whether the write has been completed.

As is apparent to one skilled in the art, the combination of the modified read process described with reference to FIG. 3 and the modified write/erase processes described with reference to FIGS. 5 and 6 provide a potential for an EEPROM with a greatly improved worst case read latency. Instead of a worst case latency approximately equal to the total time required for an erase/write cycle to be completed, the worst case latency is approximately equal to the time required to perform one erase or write pulse. Using the timing examples given in the Gee et al. patent, a total erase/write cycle may require as long as 20 milliseconds, depending on the number of iterations of the erase and write pulses required. A single erase or write pulse, however, may require only 2 or 3 milliseconds.

While the present invention has been shown and described with reference to a particular embodiment thereof, various modifications and changes thereto will be apparent to those skilled in the art and are within the spirit and scope of the present invention.

An example of such a modification might be, for instance, the substitution of a non-iterative write/erase control process for the iterative process described. It is possible to design an intelligent, or autonomous, EEPROM which allows a controlling CPU to proceed with other tasks after having issued a write or a read request, just as does the EEPROM described above, but which does not use an iterative process of several write/erase pulses interspersed with verify cycles as does the described embodiment. In fact, such a non-iterative intelligent EEPROM may benefit to an even greater extent from the advantages of the present invention, since a non-iterative write/erase process is typically longer than an iterative process. Another possible modification involves the choice of whether to compare a read address to a previous write address on every read or only on those reads which interrupt writes. The comparison may be executed and responded to on every read, as is implied in FIG. 3, or it may be performed only on those reads which interrupt a write. The latter approach may be advantageous in some circumstances to ensure that the data being read is what is actually in the array.

I claim:

1. In an EEPROM comprising an array of EEPROM cells, read means for reading one of said cells in response to receipt of a read control signal and a read address and means for write means for writing at least one of said cells in response to receipt of a write control signal, a write address and data and wherein said write means further comprises write control means for iteratively applying a write pulse to said at least one cell and reading said at least one cell until said at least one cell is in a desired state, the improvement comprising:

means for halting said write control means in response to receipt of said read control signal and read address, for activating said read means and for restarting said write control means after said read means has completed responding to said read control signal and read address;

latch means for storing said write address and said write data;

compare means for comparing said write address to said read address; and read output means responsive to said compare means to select one of said latch means and said cell as a source of data to be output in response to said read control signal and read address.

2. The EEPROM of claim 1 wherein said write means further comprises erase control means for iteratively applying an erase pulse to said cell and reading said cell until said cell is erased prior to activating said write control means and wherein the improvement further comprises:

means for halting said erase control means in response to receipt of said read control signal and read address, for activating said read means and for restarting said erase control means after said read means has completed responding to said read control signal and read address.

3. The EEPROM of claim 2 wherein the improvement further comprises:
latch means for storing said write address and said write data;
compare means for comparing said write address to said read address; and
read output means responsive to said compare means to select one of said latch means and said cell as a source of data to be output in response to said read control signal and read address.

4. An intelligent EEPROM comprising:
an array of EEPROM cells arranged in a first plurality of rows and a second plurality of columns;
address decode means for selecting one of said rows and at least one of said columns in response to receipt of an address;
address means for receiving an address from an address bus and for providing said address to said address decode means;
sense means coupled to said address decode means for determining a state of at least one of said EEPROM cells located at an intersection of said selected row and column;
data means for providing bidirectional communication with a data bus; and control means for responding to a read control signal by operating said address means to provide a read address to said address decode means and operating said sense means and data means to provide an output to said data buss indicative of said state of said at least one of said EEPROM cells, and for responding to a write control signal by operating said address means to provide a write address to said address decode means and operating said data means to receive write data from said data bus and by changing said state of at least one of said EEPROM cells, if necessary, to correspond to said write data; wherein said control means further comprises:
write interrupt means for responding to said read control signal while said write control signal is being responded to by halting said response to said write control signal, completing said response to said read control signal and then completing said response to said write control signal;
said address means further comprises first latch means for storing said write address;
said data means further comprises second latch means for storing said write data; and
said control means further comprises: compare means for comparing said read address to said write address; and output select means responsive to said compare means for coupling one of said sense means and said second latch means to said data bus.

5. The intelligent EEPROM of claim 4 wherein said control means is further responsive to said write control signal by operating said address means to provide said write address to said address decode means and by erasing said one of said EEPROM cells prior to changing its state, if necessary, to correspond to said write data, and wherein said control means further comprises:
erase interrupt means responsive to said read control signal while said one of said EEPROM cells is being erased by halting said erasing, completing said response to said read control signal and then completing said erasing.

6. The intelligent EEPROM of claim 5 wherein said address means further comprises first latch means for storing said write address, wherein said data means further comprises second latch means for storing said write data and wherein said control means further comprises:
compare means for comparing said read address to said write address; and
output select means responsive to said compare means for coupling one of said sense means and said second latch means to said data bus.

* * * * *

UNITED STATES PATENT AND TRADEMARK OFFICE
CERTIFICATE OF CORRECTION

PATENT NO. : 5,034,922
DATED : July 23, 1991
INVENTOR(S) : Bradley G. Burgess It is certified that error appears in the above-identified patent and that said Letters Patent is hereby corrected as shown below:

Column 6, line 38, after "address and", insert --write--.

Column 7, line 31, change "buss" to "bus".

Signed and Sealed this

Third Day of May, 1994

Attest:

BRUCE LEHMAN

*Attesting Officer*     *Commissioner of Patents and Trademarks*